United States Patent [19]

Young et al.

[11] Patent Number: 4,592,975

[45] Date of Patent: Jun. 3, 1986

[54] METHOD FOR REPAIRING A PHOTOMASK BY LASER-INDUCED POLYMER DEGRADATION

[75] Inventors: Peter L. Young, South Barrington; Modest M. Oprysko, Roselle; Mark W. Beranek, Arlington Heights, all of Ill.

[73] Assignee: Gould Inc., Rolling Meadows, Ill.

[21] Appl. No.: 622,367

[22] Filed: Jun. 20, 1984

[51] Int. Cl.$^4$ ............................ G03F 9/00; B23K 9/00
[52] U.S. Cl. ........................................ 430/5; 430/321;
430/945; 427/142; 427/53.1; 219/121 LE;
219/121 LF
[58] Field of Search .................. 430/5, 321, 292, 945,
430/290; 427/53.1, 140, 142; 219/121 L, 121
LD, 121 LE, 121 LF

[56] References Cited

U.S. PATENT DOCUMENTS

| | | | |
|---|---|---|---|
| 3,549,733 | 12/1970 | Caddell | 264/25 |
| 3,574,657 | 4/1971 | Burnett | 430/302 |
| 3,723,121 | 3/1973 | Hauser | 430/20 |
| 3,730,734 | 5/1973 | Delzenne | 430/292 X |
| 3,748,975 | 7/1973 | Tarabocchia | 430/5 X |
| 3,787,873 | 1/1974 | Sato et al. | 346/1 |
| 3,847,644 | 11/1974 | Erhardt et al. | 117/36.7 |
| 4,059,461 | 11/1977 | Fan et al. | 148/1.5 |
| 4,200,668 | 4/1980 | Segal et al. | 427/53.1 |
| 4,340,617 | 7/1982 | Deutsch et al. | 427/53.1 |
| 4,340,654 | 7/1982 | Campi | 430/5 |
| 4,444,801 | 4/1984 | Hongo et al. | 427/10 |
| 4,444,869 | 4/1984 | Chonan et al. | 430/325 |
| 4,463,073 | 7/1984 | Miyauchi et al. | 430/5 |
| 4,510,222 | 4/1985 | Okunaka et al. | 430/5 |

OTHER PUBLICATIONS

Jain et al., "Ultrafast Deep UV Lithography with Excimer Lasers", IEEE Electron Device Letters, vol. EDL-3(3), Mar. 1982, pp. 53–55.
Pacansky et al., "Photochemical Decomposition Mechanisms for AZ-Type Photoresist", IBM Research Development, vol. 23, No. 1, Jan. 1979, pp. 42–51.
Moulic et al., "Direct IC Pattern Generation by Laser Writing", 1980, IEEE International Solid-State Circuits Conf., pp. 210–211, Feb. 15, 1980.

Primary Examiner—John E. Kittle
Assistant Examiner—José G. Dees
Attorney, Agent, or Firm—Jeannette M. Walder; Edward E. Sachs; G. Paul Edgell

[57] ABSTRACT

A method for repairing clear defects on a photomask. The method includes the steps of coating the photomask with a positive photoresist; exposing the photoresist to a laser beam for localized heating thereof to a temperature above 500° C. to darken or char the polymer; and removing the unexposed polymer from the photomask. The method may also include the intermediate step of heating the polymer to a temperature between 200° C. and 500° C. to brown the polymer before the polymer is exposed to the laser which heats it to a temperature above 500° C.

27 Claims, 1 Drawing Figure

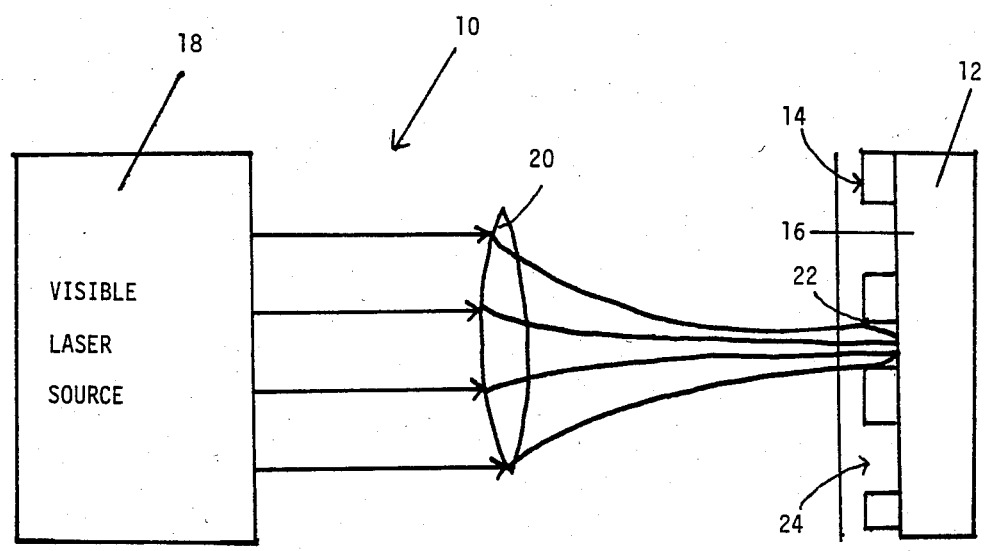

METHOD FOR REPAIRING A PHOTOMASK BY LASER-INDUCED POLYMER DEGRADATION

TECHNICAL FIELD

The present invention relates to a method for repairing a photomask and more particularly to a method for repairing a photomask by laser-induced degradation of a polymer coating the photomask to change the color of the polymer without damaging the photomask.

BACKGROUND OF THE INVENTION

A known method for repairing a photomask is shown in the U.S. Pat. No. 4,340,654. This method includes the steps of coating a photomask having a transparent substrate with a material such as a starch polymer, the thickness of the coating being between 5 and 35 microns; directing a laser beam through the substrate of the photomask onto the coating so as to fuse the coating and substrate to form an opaque mixture thereof; and removing any unfused coating material from the photomask surface.

The technique suffers from several disadvantages. When fusing the coating and the substrate, the laser burns valleys into the substrate, damaging it. If any coating is fused to an area of the substrate where it is undesired, the coating cannot be removed. This method not only causes damage to the substrate, but can add unremovable defects to the photomask in areas where none existed before. Further, when using this technique one cannot demonstrate a resolution of 5 microns or less.

DISCLOSURE OF THE INVENTION

In accordance with the present invention, the disadvantages of prior methods for repairing clear defects in photomasks have been overcome. The method of the present invention repairs clear defects on a photomask by laser-induced degradation of a polymer coating the photomask without causing damage thereto.

In one embodiment of the present invention, the method for repairing clear defects on a photomask includes the steps of coating the photomask with a novolak-based polymer having a thickness between 2,000Å and 20,000Å; exposing the polymer coating a defective area of the photomask to a laser for localized heating thereof to a temperature above 500° C. to darken the polymer; and removing the unexposed polymer from the photomask.

In a second embodiment, the method for repairing clear defects on a photomask includes the steps of coating the photomask with a novolak-based polymer; heating the polymer to a temperature of between 200° C. and 500° C. to brown the polymer; exposing the polymer covering a defective area of the photomask to a laser for localized heating thereof to a temperature which is greater than 500° C. to char or darken the polymer; and removing the unexposed polymer from the photomask.

The method of the first and second embodiments of the present invention darkens or chars the polymer coating the defective area of the photomask without altering or damaging the photomask substrate. Also, if the polymer is charred in an area where it is undesired, the charred polymer can be removed without damaging either the photomask substrate or the metal pattern forming the mask on the substrate. Further, the resolution of this process is better than 2 μm; the optical density of the repaired area is greater than 2.5; and the repair is able to withstand the standard cleaning processes to which a photomask may be subjected.

These and other objects and advantages of the invention, as well as the details of an illustrative embodiment, will be more fully understood from the following description and the drawing.

BRIEF DESCRIPTION OF THE DRAWING

The drawing is a block diagram illustrating the method of the present invention for repairing a photomask.

BEST MODE FOR CARRYING OUT THE INVENTION

The method of the present invention repairs clear defects on a photomask 10 having a transparent substrate 12 with a metal pattern or mask 14 formed on a surface 16 thereof. The method employs a visible or infrared laser. In one mode, an argon ion laser 18 is focused by a microscope objective 20 onto a defective area of the photomask 22 as described in detail below.

One embodiment of the method includes the step of coating the surface 16 of the photomask with a novolak-based polymer by spinning the polymer onto the photomask to form a coating layer 24, the thickness of which is between 2,000Å and 20,000Å. The novolak-based polymer is preferably a positive photoresist. Further, the preferred thickness of the coating layer is greater than or equal to 4,000Å to insure that the laser does not burn a hole in the photoresist. The preferred thickness of the coating layer is also less than or equal to 9,000Å to insure that the photoresist layer 24 will be charred through to the face thereof abutting the surface 14 of the photomask when the photoresist is exposed to laser radiation. After coating the photomask with the polymer layer 24, that portion of the polymer coating a defective area of the photomask 22, is exposed to a laser beam from the visible laser or infrared source 18 for localized heating thereof to a temperature which is above 500° C. to darken or char the polymer exposed to the laser. Thereafter, that portion of the polymer which has not been exposed to the laser is removed by immersing the photomask in a solvent such as acetone.

In order to accurately carry out the method of the present invention, the laser from the source 18 should have a pulse length between 1 μsecond to 500 milliseconds, the preferred pulse length of the laser being between 100 μseconds and 10 milliseconds. Further, the surface power of the laser should be between 0.01 milliwatts and 50 milliwatts and such that the laser is incident to an area on the photomask having a diameter of approximately 1 μm.

The above method darkens or chars the polymer coating the defective area of the photomask without altering or damaging the substrate 12. Because the substrate 12 is not damaged while making the repair, if a portion of the polymer coating 24 is charred where it is undesired, the charred polymer may be removed by scanning the area with a laser as well known in the art. Further, the resolution of this method is better than 2 μm and the optical density of the repaired area is greater than 2.5. The repair made according to this method is also extremely durable and capable of withstanding the standard processes for cleaning a photomask.

In a second embodiment of the method of the present invention for repairing clear defects on a photomask, an additional step is performed. After coating the photomask 10 with the novolak-based polymer, the polymer is heated to a temperature which is between 200° C. and 500° C. to brown the polymer. The polymer may be heated by scanning a laser across the surface thereof with the power of the laser source 18 adjusted so that the laser heats the polymer to the temperature at which it will brown without charring. After the polymer layer 24 is browned, the polymer coating a defective area of the photomask is exposed to a laser from the visible laser source 18. The power of the laser source 18 is adjusted for localized heating of the polymer to a temperature which is greater than 500° C. to darken or char the polymer. Thereafter, that portion of the polymer which is not exposed to the laser is removed, again by immersing the photomask 10 in a solvent such as acetone.

The second embodiment of the method of the present invention darkens or chars the polymer layer 24 exposed to the laser without altering or damaging the substrate as does the first embodiment of the method. The resolution of this process is also greater than 2 $\mu$m, the optical density of the repaired area being greater than 2.5 and the repair being capable of withstanding the standard cleaning process to which a photomask is subjected.

Although the method of the first embodiment is suitable for repairing spot type clear defects on the photomask, lines are difficult to draw with this method. However, the step of browning the polymer layer 24 prior to charring the polymer covering the defective area of the photomask, as in the second embodiment of the method, allows a line to be drawn by the visible laser source 16 when the power thereof is adjusted to heat the polymer to which the laser beam is incident to a temperature which is greater than 500° C. In the second embodiment, the thickness of the polymer coating 24 may be the same as the thickness of the polymer coating for the first embodiment of the method. However, the preferred pulse length of the laser from the source 18 for the second embodiment is between 1 second and 20 seconds for charring the polymer. Further, the preferred surface power of the laser from the source 18 is between 0.1 milliwatts and 5 milliwatts for charring the polymer.

In the preferred embodiment, the novolak-based polymer is used because it exhibits the following properties. These properties are: (1) excellent uniform film-forming characteristics; (2) differential substrate adhesion after charring; and (3) the ability to become opaque to near-ultraviolet light upon heating.

The uniform film-forming characteristics of the novolak-based polymer have been developed by others skilled in the art to the extent that very uniform films on the order of 2,000Å to 20,000Å can be formed. Other materials may be used having uniform film-forming characteristics. Uniform film-forming characteristics are desirable because uniformity enhances the reproducibility of the process. A nonuniform film causes the process to behave unpredictably when attempting to repair very small clear defects in a photomask.

Adequate adhesion is required for the material used prior to and after heating. In the preferred embodiment, the material has increased adhesion characteristics after heating. Such a characteristic enhances the ability to remove unheated portions selectively without affecting the characteristic of the charred or heated portion.

As noted above, another desirable feature of the material used in this invention in the preferred embodiment is that the material exhibits thermosetting properties. In the currently preferred embodiment, using a novolak-based polymer, it should be noted that the novolak-based polymer initially exhibits thermoplastic characteristics prior to heating. It is important to first convert the novolak-based polymer to a more thermosetting-like material prior to charring. This conversion process is accomplished by first slowly heating the material in a controlled manner to a temperature which causes the novolak-based polymer to brown. Empirically, this temperature has been discovered to be approximately 200° C. to 500° C. in the preferred embodiment. It is believed this "browning" stage causes the novolak-based polymer to convert from a thermoplastic-like resin to a thermosetting-like resin. Although novolak-based polymers are currently used in the preferred embodiment because they exhibit acceptable characteristics as discussed above, in future embodiments, it is envisioned that it would be highly desirable to use a resin which has greater thermosetting characteristics.

The third characteristic listed above is that the material used in the preferred embodiment becomes opaque when subjected to heating. In the preferred embodiment, the optical density of the material used should be at least 2.5 in the presence of ultraviolet light. In most photolithography processes, near ultraviolet light is used. If other forms of light are used, the material used in accordance with this invention should exhibit similarly opaque characteristics.

A novolak-based polymer is a polymer which is formed by a condensation reaction between formaldehyde and phenol in the presence of acid catalysts wherein the mole ratio of formaldehyde to phenol is less than 1. Novolak is the base polymer in a positive photoresist. It is important to note that other materials can be used other than novolak-based polymers in accordance with the present invention provided that they exhibit satisfactory characteristics as discussed above. For the purposes of this application, thermoset-like means the material does not flow significantly when heated.

This application is related to U.S. patent application Ser. No. 622,366, filed June 20, 1984, entitled "Method for Depositing a Micron-Size Metallic Film on a Transparent Substrate Utilizing a Visible Laser", and U.S. Pat. No. 4,543,270, patent application Ser. No. 622,368, filed June 20, 1984, entitled "Laser-Based System for the Total Repair of Photomasks." Both of these applications are incorporated herein by reference.

Although the invention has been described and illustrated in detail, it is to be clearly understood that the same is by way of illustration and example only, and is not to be taken by way of limitation; the spirit and scope of this invention being limited only by the terms of the appended claims.

We claim:

1. A method for repairing clear defects on a photomask comprising:
    coating the photomask with a novolak-based polymer;
    directing a laser beam onto a portion of the novolak-based polymer coating for localized heating thereof to a temperature above 500 degrees Celsius to degrade the novolak-based polymer without damaging the photomask wherein the degraded novolak-based polymer has an optical density of at least 2.5; and removing that portion of the novolak-based polymer coating not degraded by the laser.

2. The method of claim 1 wherein said laser is a visible laser.

3. The method of claim 1 wherein said laser is an infrared laser.

4. The method of claim 1 wherein the step of removing the novolak-based polymer includes the step of immersing the photomask in acetone.

5. The method of claim 1 wherein the thickness of the photoresist is between 2,000Å and 20,000Å.

6. The method of claim 5 wherein the thickness of the photoresist is between 4,000Å and 9,000Å.

7. The method of claim 1 wherein the laser has a pulse length of between 1 µsecond to 500 milliseconds.

8. The method of claim 7 wherein the laser has a pulse length of between 100 µseconds and 10 milliseconds.

9. The method of claim 1 wherein the surface power of the laser is between 0.01 milliwatts and 50 milliwatts.

10. The method of claim 9 wherein the laser is incident to an area on the photomask having a diameter of approximately 1 µm.

11. A method for repairing clear defects on a photomask comprising:

coating the photomask with a polymer;

directing a laser beam onto a defective area of the photomask for localized heating thereof to a temperature between 200 degrees Celsius and 500 degrees Celsius to brown the polymer;

re-directing a laser beam onto the polymer coating the defective area of the photomask for localized heating thereof to a temperature above 500 degrees Celsius to degrade or char the polymer without damaging the photomask wherein the degraded polymer has an optical density of at least 2.5; and removing that portion of the polymer coating not browned or degraded by the laser.

12. The method of claim 11 wherein the polymer contaisn novolak.

13. The method of claim 11 wherein the polymer is a positive photoresist.

14. The method of claim 11 wherein the laser is a visible laser.

15. The method of claim 11 wherein the polymer coating has a thickness between 2,000Å and 20,000Å.

16. The method of claim 11 wherein the laser has a pulse length of between 1 µsecond and 500 milliseconds for charring the polymer.

17. The method of claim 16 wherein the laser has a pulse length of between 1 µsecond and 20 µseconds for charring the polymer.

18. The method of claim 11 wherein the surface power of the laser is between 0.01 milliwatt and 50 milliwatts for charring the polymer.

19. The method of claim 18 wherein the surface power of the laser is between 0.1 milliwatt and 5 milliwatts for charring the polymer.

20. The method of claim 18 wherein the laser is incident to an area on the photomask having a diameter of approximately 1 µm.

21. The method of claim 11 wherein the photomask has a transparent substrate.

22. The method of claim 11 wherein the area of the polymer charred by the laser has a diameter which is less than or equal to 2 µm.

23. The method of claim 11 wherein the laser is an infrared laser.

24. A method for repairing clear defects as recited in claim 11 wherein said polymer has relatively greater adhesion characteristics after degrading than prior to degrading.

25. A method for repairing clear defects as recited in claim 11 wherein said polymer is removed with a solvent, and wherin said polymer has greater adhesion characteristics to said photomask after said polymer is degraded with respect to said solvent.

26. A method for repairing clear defects as recited in claim 11 wherein said polymer exhibits theremosetting-type characteristics while degrading.

27. A method for repairing clear defects as recited in claim 11 wherein said polymer is a thermoplastic-type resin prior to directing said laser on said defect, and wherein when said laser is directed on said defect, the polymer is heated in a controlled manner to cause said polymer to convert from a thermo-plastic-like-type polymer to a thermosetting-like-type polymer.

* * * * *